Figure 1A:
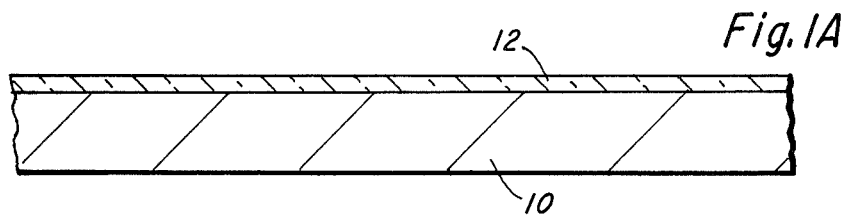
Figure 1B:
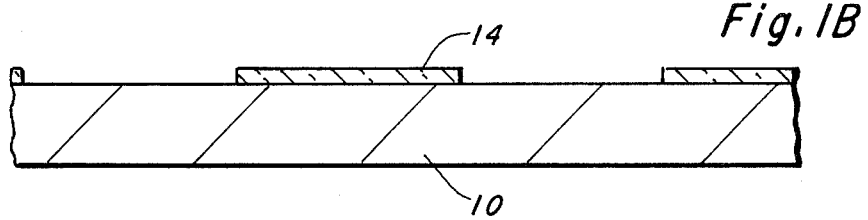
Figure 1C:
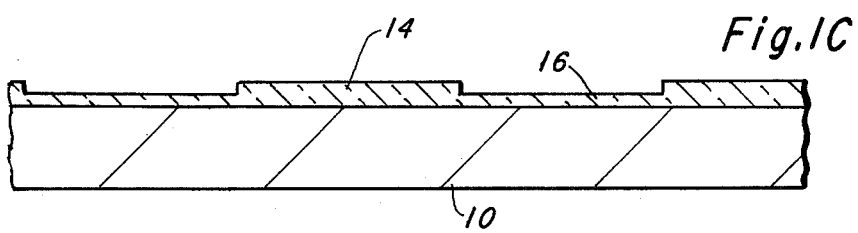

United States Patent [19]

Tasch et al.

[11] 4,035,906
[45] July 19, 1977

[54] SILICON GATE CCD STRUCTURE

[75] Inventors: Al F. Tasch, Richardson, Tex.; Robert C. Frye, Brighton, Mass.

[73] Assignee: Texas Instruments Incorporated, Dallas, Tex.

[21] Appl. No.: 737,648

[22] Filed: Nov. 1, 1976

Related U.S. Application Data

[63] Continuation of Ser. No. 598,316, July 23, 1975, abandoned.

[51] Int. Cl.² .............................................. B01J 17/00
[52] U.S. Cl. ........................................ 29/578; 29/589; 148/188; 357/24; 357/59; 357/91
[58] Field of Search ................. 29/578, 589, 590, 591; 148/188; 357/24, 59, 91

[56] References Cited
U.S. PATENT DOCUMENTS

| | | | |
|---|---|---|---|
| 3,673,679 | 7/1972 | Carbajal | 29/578 |
| 3,908,262 | 9/1975 | Stein | 357/91 |
| 3,924,319 | 12/1975 | Moksen | 29/578 |
| 3,931,674 | 1/1976 | Amelio | 29/578 |
| 3,933,529 | 1/1976 | Goser | 148/188 |

*Primary Examiner*—W. Tupman
*Attorney, Agent, or Firm*—Harold Levine; Richard L. Donaldson; James T. Comfort

[57] ABSTRACT

Processes for manufacturing two-phase charge coupled devices (CCDs) having marginally overlapping phase electrodes and utilizing a single insulating material. Offset self-alignment techniques are used to achieve accurate location of ion implanted potential well or potential barrier regions to achieve the required asymmetry of potential wells (or threshold voltages) in each gate region of the CCD with small bit or charge storage element sizes leading to structures having a high packing density. Fabrication of surface and buried channel structures is described.

16 Claims, 21 Drawing Figures

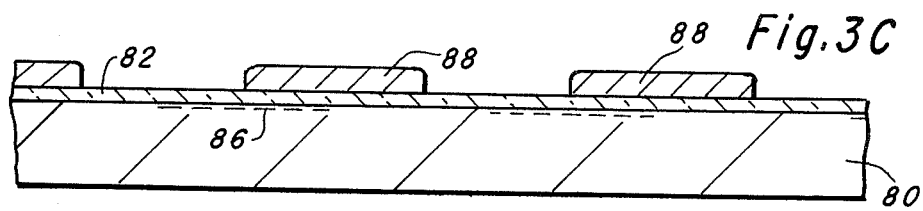
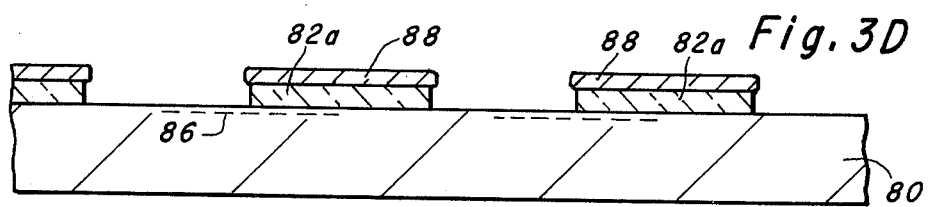
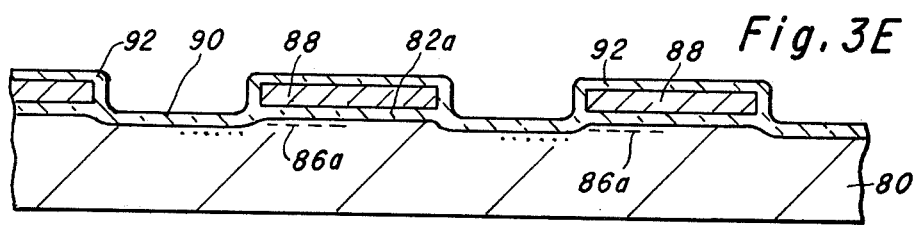
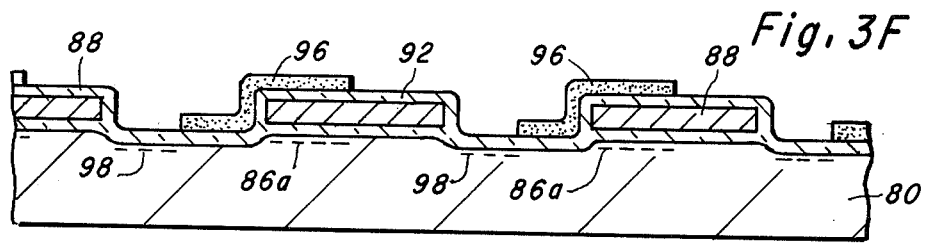
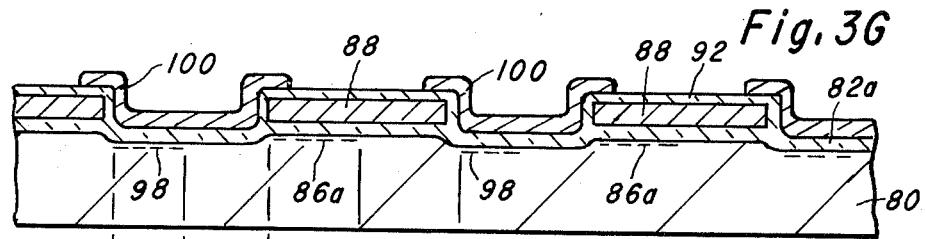

SILICON GATE CCD STRUCTURE

This is a continuation, of application Ser. No. 598,316, filed July 23, 1975, now abandoned.

This invention relates to methods for fabricating charge-coupled devices (CCDs) and, more particularly, to improved fabrication methods for fabricating phase electrode structures suitable for operation of a CCD structure by a two-phase clock pulse source.

CCD structures have become well known in the semiconductor art and structures suitable for operation by one, two, three and four phase clock pulse sources have been described in the literature. The present invention is primarily concerned with CCD structures suitable for operation by a two-phase clock pulse source, methods for fabrication of such structures having previously been described, for example, at the I E D M, December, 1973, by R. W. Bower, T. A. Zimmerman and A. M. Mohsen, in a paper entitled "A High Density Overlapping Gate Charge Coupled Device Array". That paper described two techniques for fabricating overlapping gates of a CCD, one technique utilizing differential insulator thicknesses between each gate and the underlying semiconductor surface and involving use of silicon oxide/silicon nitride insulating layers while in the other technique described alternate electrodes have a differential thickness insulating layer separating them from the underlying semiconductor surface, and beneath the remaining electrodes an implanted doped region is located in the semiconductor surface beneath a portion of each electrode. Both techniques result in asymmetric potential wells at each gate region.

It is an object of the present invention to provide improved processes for fabricating CCD structures suitable for operation from a two-phase clock pulse source.

It is a further object of the invention to provide improved processes for fabricating such CCD structures which permit use of a single insulating material to separate the gate electrodes from the underlying semiconductor surface, as well as from each other.

In one aspect of the invention, spaced polycrystalline semiconductor electrodes are formed on differential thickness insulator regions spaced apart along the channel length of the CCD. Dopant ions are implanted into regions of the semiconductor surface between the insulator regions and then the whole of the semiconductor surface areas between the differential thickness insulator layers are covered with the same insulating material to about the thickness of the relatively thick portions of the differential thickness areas, as well as to cover the polycrystalline semiconductor electrode strips. In this manner, in the region between the differential thickness insulator regions, the surface potential at the implanted areas differs from that of the nonimplanted areas. Conductive electrodes are then formed over the further insulating material between the polycrystalline electrodes such that marginal edge portions thereof overlap adjacent polycrystalline semiconductor material electrodes. In the resulting structure, a bit length of the CCD is defined by the overall length along the channel of a polycrystalline semiconductor electrode and a next adjacent one of the further electrodes and it will be appreciated that along the length of each bit, relatively thick insulator regions separate the electrodes from the underlying semiconductor surface.

In a further aspect of the invention, all the gate electrodes are separated from the underlying semiconductor surface by a uniform thickness insulator layer. Initially, dopant ions are implanted into a uniform thickness insulating layer formed over the semiconductor surface along the CCD channel. The implant energy is adjusted so that the implanted ions are totally confined to the insulating layer. Polycrystalline semiconductor material electrode strips are then formed to extend transversally across the channel and to partly overlie respective ones of the implanted regions. The polycrystalline semiconductor material is deposited at low temperatures and is doped before patterning during deposition, or by ion implantation in order to avoid premature out-diffusion of the implanted ions in the insulating layers. Insulator material between the polycrystalline strips is then removed and fresh insulating material formed to the same thickness as the original insulator layer, using a process which causes significant out-diffusion of the implanted copant impurities remaining in the insulating layer beneath the polycrystalline strips to form first modified surface potential regions underlying first portions of the polycrystalline strips. In this way the first modified surface potential regions are self aligned to the modified surface edge of the polycrystalline strips, which is important for good device performance. Further dopant ions are then implanted into portions of the semiconductor surface between the polycrystalline semiconductor strips and adjacent to an edge of the respective polycrystalline semiconductor strips not underlaid by an ion implanted region. The edge of the polycrystalline strip masks the implant so that the implanted ions are self-aligned to the polycrystalline strips. Further conductive electrodes are then formed between and marginally overlapping adjacent polycrystalline semiconductor strips.

In yet a further aspect of the invention, spaced apart doped regions are implanted into a semiconductor surface beneath a uniform thickness of insulating material to extend across the CCD channel. Polycrystalline semiconductor electrode strips are then formed across the channel to partly overlie portions of the implanted areas. Insulating material is then removed between the polycrystalline strips and replaced by a layer of the same insulating material to the same thickness as the original insulating layer as well as to cover the polycrystalline strips, using a process causing significant diffusion of dopant impurities into the insulating material from semiconductor surface areas not overlaid by the polycrystalline semiconductor strips. Doped surface areas are then implanted into portions of the semiconductor surface between the polycrystalline semiconductor strips and adjacent the edges of respective ones of the polycrystalline strips beneath which there is no implanted doped region. Conductive electrodes are then formed between and marginally overlapping the polycrystalline strip electrodes.

In carrying out any of the above described processes, silicon may be used as the semiconductor material and silicon oxide, preferably thermally grown, as the insulator material. The polycrystalline semiconductor material also may be silicon and the second level electrodes may be metal, e.g., aluminum, or polycrystalline semiconductor material, e.g., silicon. The fabrication processes are suitable for fabrication of n-channel and p-channel CCD structures.

By way of example, and in order to describe various embodiments of the invention in greater detail, together with advantages thereof, reference will be made to the drawings wherein FIGS. 1A-1H, 2A-2F and 3A-3G each shows a section along the channel length of a CCD structure during various stages in the fabrication thereof, in respect of respective embodiments of the invention.

In each of the embodiments of the invention to be described, the phase electrode structure of the CCD is formed over a channel region defined in a semiconductor substrate. The channel is peripherally bounded by channel stop regions and includes appropriate structure for inputting signals, in the form of charge packets, into the channel beneath one or more selected phase electrodes. These charge packets are propagated along the channel by suitable clock pulses applied to phase electrodes located above the channel and insulated from the semiconductor surface, the charge packets being extracted as output signals by suitable output structure. As thus far described, the CCD structure and methods of fabricating it are known in the art and, since they do not form part of the present invention, will not be further described. The following description will relate primarily to fabrication of the phase electrode structure used to propagate charge packets along the channel of the CCD.

It will be assumed tht the semiconductor material is silicon and that an n-channel (p substrate) CCD is being fabricated. However, it is to be appreciated that the concept of the invention is applicable also to fabrication of p-channel (n-substrate) CCD structures as well as to CCD structures utilizing other semiconductor materials, for example, germanium and gallium arsenide.

Referring to FIG. 1, FIG. 1A depicts a p-type silicon substrate 10 on the upper surface of which is an insulating layer 12, conveniently formed by thermal growth of silicon dioxide at a temperature in the range 900°-1100° C. to a thickness in the range 2000°-4000° A. The oxide layer 12 is grown to have a uniform thickness over the length of the channel of the CCD. The silicon oxide layer 12 is then patterned, using conventional photolithographic techniques, to expose, along the length of the channel, areas of the surface of the substrate 10 separated by intervening areas 14 of silicon oxide (FIG. 1B). Relatively thin silicon oxide areas 16 suitably having a thickness of about 100A. are then formed over the exposed surface areas of the substrate 10, again suitably using thermal growth techniques. Thus, the relatively thick and thin silicon oxide areas 14 and 16 alternate along the length of the channel of the CCD as depicted in FIG. 1C.

Figure 1D:
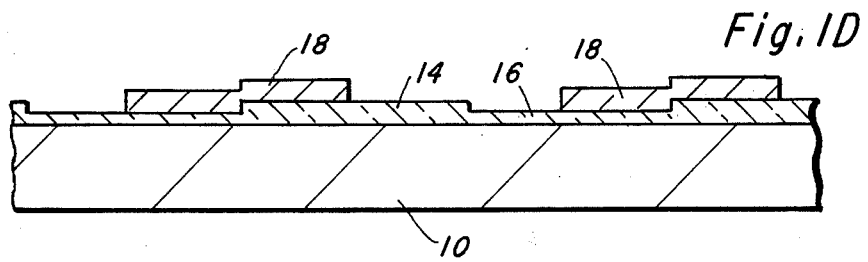
Figure 1E:
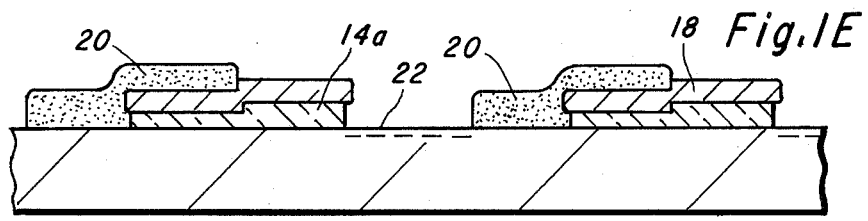

A layer of polycrystalline silicon, appropriately doped so that it will provide a high conductivity electrical conductor, is then deposited over the silicon oxide areas 14, 16 and patterned, again using conventional photolithographic techniques, to form conductive phase electrode strips 18 extending transversely across the CCD channel. Wet chemical or plasma etching can be employed. Referring to FIG. 1D, it will be noted that the electrodes are offset aligned relative to the thick and thin oxide areas 14, 16 so that with reference to the length of the CCD channel, part, e.g., one-half, the length of each electrode 18 overlies part the length of a thick silicon oxide area 14 while the remainder of each strip electrode 18 overlies part, e.g. one-half, the length of a relatively thin silicon oxide area 16. the electrodes 18 are then masked, and the portions of the thick and thin silicon oxide areas 14 and 16 between adjacent electrodes 18 are etched to expose the underlying surface of the silicon substrate 10. A layer of photoresist is then formed over the upper surface of the structure shown in FIG. 1D, and patterned, again using conventional photolithographic techniques, to form photoresist regions 20 which leave uncovered an appropriate fraction, e.g. one-half, the length of each exposed substrate area next adjacent the remaining portions 14a of the thick silicon oxide areas, as shown in FIG. 1E. It will be seen that one lateral boundary of the unmasked areas 22 of the silicon substrate surface is defined by the lateral edge of a silicon oxide area 14a while the other lateral boundary is defined by an edge of a photoresist area 20. Thus, since only one edge of each photoresist area 20 needs to be accurately defined within a specific tolerance, the required degree of accuracy and small geometry can readily be obtained using conventional photolithographic techniques.

N-type dopant ions, suitably phosphorus or arsenic, are then implanted into the exposed surface areas of the silicon substrate, suitably using a beam energy of 20-50 KeV, to form implanted layers 24 providing positive surface charge layers. The photoresist areas 20 and the polysilicon electrodes 18 act as implantation masks. A suitable dosage is about $1 \times 10^{12} cm^{-2}$. The implanted layers 24 serve to reduce the threshold voltage in the implanted areas or, alternatively stated, to form potential wells in those areas.

If desired, a thin layer of silicon oxide, e.g. about 500-1000A, could be formed over the exposed surface areas of the substrate 10, prior to formation of the photoresist mask areas 20 and carrying out the ion implantation step. In either event, following the implantation step, the photoresist regions 20 are stripped and silicon oxide 26 is formed, again preferably using a thermal oxidation process, over the areas between the strip electrodes 18 until it reaches a thickness slightly less or equal to the thick silicon oxide portions 14a, during this step the polysilicon strip electrodes 18 also being covered with a layer of silicon oxide 26 which is thicker due to the more rapid oxidation of the phosphorus-doped polysilicon. A layer of metal or polycrystalline semiconductor (suitably aluminum or polycrystalline silicon) is then formed and patterned to define phase electrode strips 26 extending across the CCD channel between the strip electrodes 18, with marginal edges of the electrodes 28 overlapping edges of adjacent ones of the strip electrodes 18.

Figure 1F:
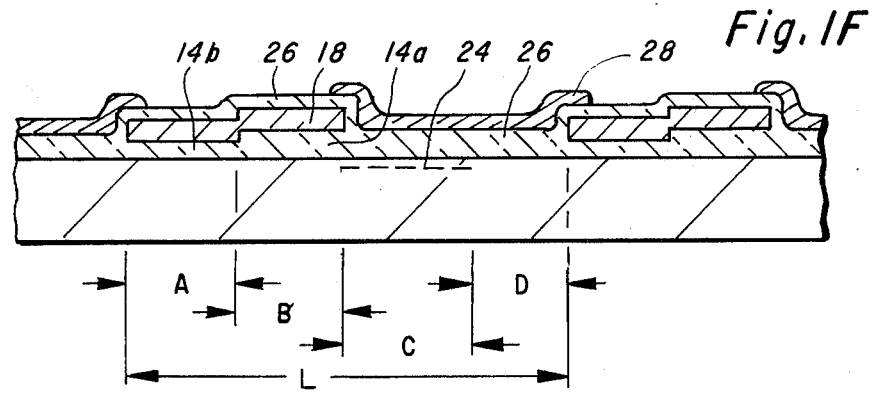
Figure 1G:
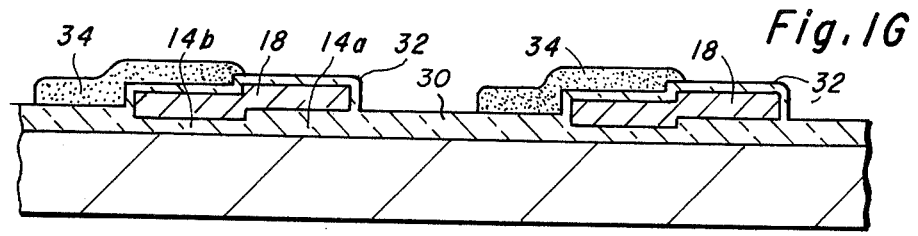

The resulting structure is shown in FIG. 1F and it is to be noted that the conductor-insulator-semiconductor structure defined by each polycrystalline silicon strip electrode 18 and the underlying silicon oxide and silicon substrate includes two regions, namely that including the thin silicon oxide portion 14b which has a lower threshold voltage than that including the thick silicon oxide portion 14a. Likewise, the conductor-insulator-semiconductor structure comprising a metal electrode 28 and the underlying silicon oxide and silicon substrate has two portions, namely that including the implanted region 24 which has a lower threshold voltage than the portion including the unimplanted surface area of the substrate 10. As a result, the required electrical asymmetry of threshold voltages associated with phase electrodes 18 and 28 is obtained that is necessary to permit operation of the resultant CCD structure by two-phase clock pulses applied to those electrodes. Alternatively viewed, in operation of the shift register with positive pulses supplied to the strip electrodes and a suitable DC bias supplied to the substrate 10, asymmetric potential wells, i.e., having different depths, are formed beneath each of the phase electrodes. In the case of the strip electrodes 18, the potential well at the region A is deeper than that at the portion B and in the case of the electrodes 28, the potential well at region C is deeper than that at region D. It will be appreciated that instead of implanting N-type dopant impurities in the region 24 to produce a potential well, P-type dopant impurities, for example boron, could be implanted in the substrate surface at the region D to form a potential barrier, thereby still achieving the required surface potential asymmetry.

Advantages of a structure produced in accordance with the above described process include the fact that each bit or element of the CCD structure, comprising the structure associated with a phase electrode 18 and an adjacent phase electrode 28, can be fabricated to have a small length L as shown in FIG. 1F, for example about 0.2–0.4 mil, thereby permitting achievement of a high packing density for the overall CCD structure. This small bit size can readily be achieved without critically small photolithographic geometries. For example, a 0.6 mil bit size would require a geometry no smaller than 0.3 mil. Additionally, problems due to intralevel shorts are completely eliminated, since each level of phase electrodes is connected to an individual phase of the clock pulses. Consequently, if necessary or desirable, the strip electrodes 28 could be replaced by a single layer of metal overlying the whole length of the channel of the CCD, thereby avoiding the necessity for intricate patterning of that layer. However, such a variation would increase the capacitive load on the clock pulse source.

Figure 1H:
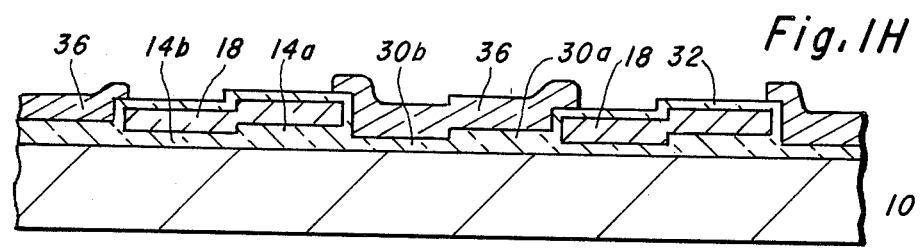

The process described above with relation to FIG. 1 can be modified as follows, following the steps described with reference to FIG. 1D, wherein, the following definition of the polycrystalline electrodes 18, the regions of silicon oxide remaining between the electrodes 18 are stripped and fresh silicon oxide layer is formed, preferably by thermal growth, to form silicon oxide areas 30 having nearly the same thickness as the thick oxide regions beneath the electrodes 18. This oxidation process also forms a silicon oxide layer 32 over the electrodes 18 as shown in FIG. 1F. A layer of photoresist is then formed over the structure and patterned to form photoresist areas 34 covering one-half of the length of each silicon oxide area 30 next adjacent the edges of the electrodes 18 overlying thin silicon oxide areas. The remaining uncovered regions of the silicon oxide areas 30 are then stripped by etching and fresh oxide areas formed, preferably by thermal growth, to the thickness of the thin silicon oxide areas beneath the electrodes 18. The oxide thickness 30b also increases to approximately that of oxide 14b. Between the electrodes 18, thick and thin silicon oxide areas 30a and 30b are thus defined as shown in FIG. 1H. Further electrodes 36, either metal or polycrystalline semiconductor, are then formed over the silicon oxide areas 30a and 30b to marginally overlap the electrodes 18 as shown in FIG. 1H. Advantages of this modification include the omission of the ion implantation step described with reference to FIG. 1E and the fact that the thickness of the oxide areas can be readily controlled to a high degree of accuracy.

Figure 2A:
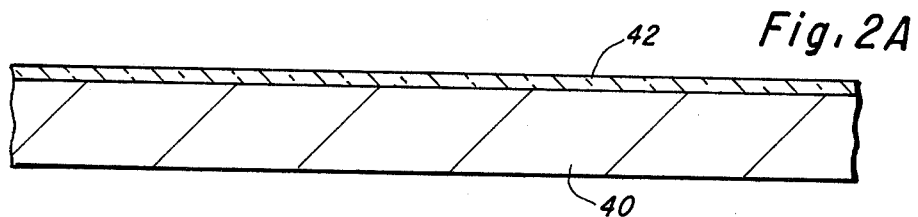
Figure 2B:
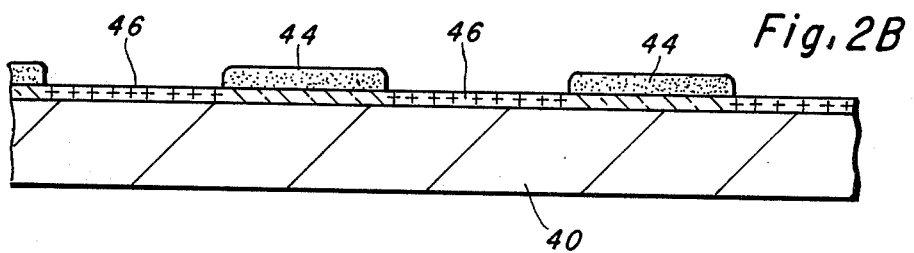
Figure 2C:
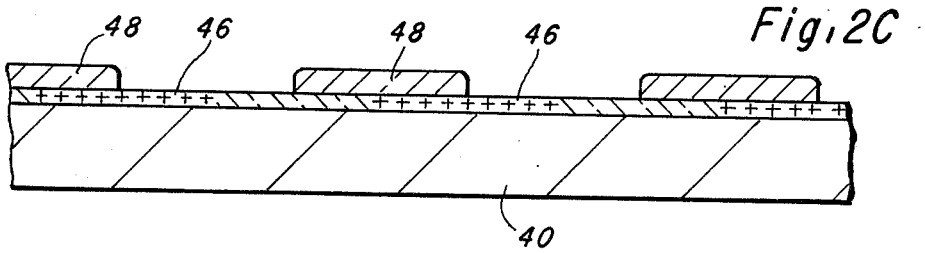

An alternative, and preferred, embodiment of the invention will be described with reference to FIG. 2. The resultant structure has a uniform thickness of insulator beneath all of the phase electrodes and implantation of dopant ions into selected areas of the semiconductor surface along the channel is used to provide the required asymmetry in surface potential for two-phase operation of the CCD structure. As shown in FIG. 2A, a p-type silicon substrate 40 has a uniform thickness silicon oxide layer 42 formed on a surface thereof to a thickness suitably of about 100 A. Thermal oxidation may suitably be used to form the silicon oxide layer 42. Using conventional photolithographic techniques, selected areas of the silicon oxide layer 42 are masked and spaced apart strips 44 of photoresist material are defined along the length of the channel. N-type dopant ions, suitably arsenic, are then implanted into regions 46 of the silicon oxide layer 42 between the photoresist strips 44. Suitably, a beam energy of 55 keV and dosage of 1.5 $\times 10^{13} cm^{-2}$ may be used, it being important that the beam energy is sufficient to implant the ions into the silicon oxide layer 42 but not into the underlying surface areas of the substrate 40. It is preferable that the dopant ions selected for the implant are characterized by a small spread in penetration depth for the beam used so that a dense layer of dopant ions is formed in each of the implanted silicon oxide areas; and that the impurity ions have a relatively large diffusion coefficient in silicon oxide and a relatively low diffusion coefficient in silicon. The structure at this stage of the fabrication process is depicted in FIG. 2B. A layer of polycrystalline silicon is then deposited over the silicon oxide layer 42 and patterned by wet etching or plasma etching in offset aligned relation to the implanted oxide areas 46 to define polycrystalline silicon strip electrodes 48 extending across the CCD channel in offset alignment relative to the implanted areas 46 so that part, e.g. one-half, the length of each polycrystalline electrode 48 (in the direction of the channel length) overlies part of the length of each implanted area 46. The polycrystalline silicon is deposited suitably at a temperature which is not high enough to result in any appreciable out-diffusion of impurities from the areas 46 into the underlying silicon substrate. Suitably a deposition temperature of 300°–800° C. may be used. The polycrystalline silicon layer may be doped during deposition to have a suitably high conductivity for provision of a good electrical conductor. Alternatively, it may be deposited undoped, and then doped by ion implantation. Suitably, an N-type purity such as phosphorus can be used with beam energy 90KeV and a dose of $10^{15}$–$10^{16}$ ions/cm$^2$ into 4000 A of polycrystalline silicon. This approach dopes the polycrystalline silicon while avoiding use of high temperature processing. In order to assist accurate alignment of the polycrystalline silicon electrodes 48, alignment markers in the silicon oxide layer layer 42 may be used.

Figure 2D:
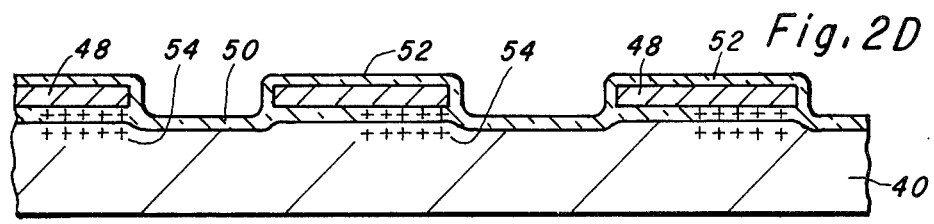
Figure 2E:
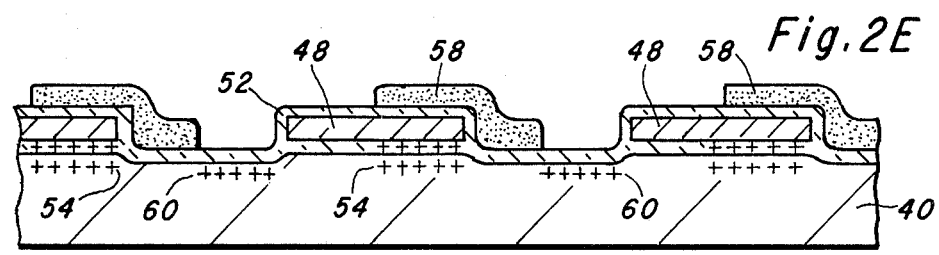

The silicon oxide areas between the electrodes 48 are then etched preferably using a wet etching process, to expose the underlying surface areas of the substrate 40. In this way, self-alignment of the arsenic implanted areas 46 with respect to the edge of the polycrystalline electrodes 48 is achieved. This is a very important feature in order to achieve good CCD performance. If self-alignment were not achieved, stray potential wells and barriers could result which would degrade the CCD performance. Fresh silicon oxide is formed, preferably using thermal growth process, over the substrate surface areas between the electrodes 48 to result in silicon oxide areas 50 about 1000 A, i.e., having the same thickness as the silicon oxide layers beneath the polycrystalline silicon electrodes 48. This oxide formation step also results in a layer 52 of silicon oxide covering the surface areas of the polycrystalline silicon electrodes 48. The temperature used to form this silicon oxide layer 50, 52 can be selected such that diffusion of the n-type dopant ions occurs out of the oxide areas 46 into the underlying surface areas 54 of the substrate 10 along the channel of the CCD, as shown in FIG. 2D; alternatively an extra high temperature process step may be employed. Suitably this temperature may be 1000°–1100° C. It is for this reason that the dopant impurities be selected to have a relatively high diffusion coefficient in silicon oxide (and relatively low diffusion coefficient in silicon) and selection of impurities to form a relatively dense layer in the silicon oxide, as discussed above, assists in providing an efficient diffusion source. Additional heat treatment, suitably within the temperature range 900°–1100° C., may be carried out if necessary to ensure sufficient diffusion of the n-type dopant out of the doped oxide areas into the underlying silicon surface.

A layer of photoresist is formed over the structure shown in FIG. 2D and patterned to define photoresist areas 58 that cover areas of the silicon oxide regions 50 adjacent to edges of the electrodes 48 beneath which there is located an implanted region 54. Each photoresist area 58 covers part, e.g. one-half, of the length (along the channel) of each silicon oxide layer 50. Again, it will be appreciated that due to the offset alignment of the photoresist areas 58 in relation to the polysilicon electrode areas 48, the uncovered areas of the silicon oxide regions 50 can be precisely defined using conventional photolithographic techniques. N-type dopant ions are then implanted into the unmasked portions of the silicon oxide regions 50, suitably using phosphorus ions and an implant energy of about 150 keV and a dosage of $1.3 \times 10^{12} cm^{-2}$, to define implanted areas 60 in the surface of the substrate 10 and extending across the width of the channel of the CCD. The structure is then subjected to a heat treatment, suitably in the range 800°–1000° C., to electrically activate the ions in the implanted areas 60.

Figure 2F:
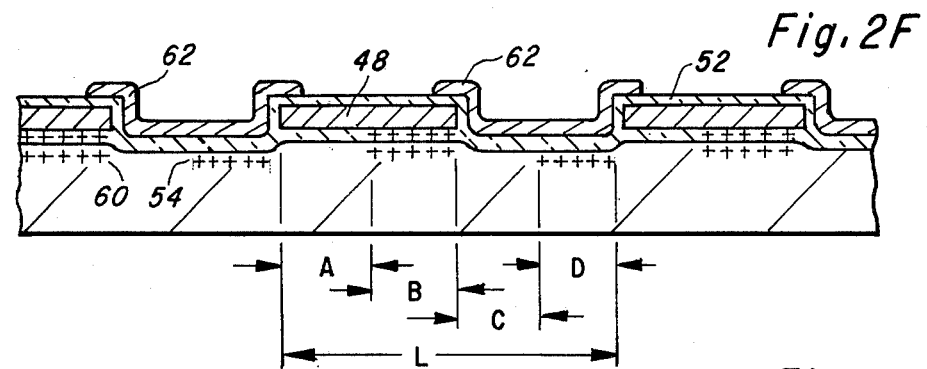

The photoresist areas 58 are then removed and a conductive layer, which may be a metal layer, e.g., aluminum, or a conductive semiconductor layer, e.g., polycrystalline silicon, is then formed over the structure and patterned to define electrodes 62 extending across the width of the channel between the polycrystalline silicon electrodes 48, the electrodes 62 having margins which overlap the edges of adjacent ones of the electrodes 48 as shown in FIG. 2F.

Again, it will be seen that the surface potential beneath (or the threshold voltage associated with) each phase electrode is asymmetric so that, beneath each electrode, a deeper potential well (lower threshold voltage) exists at the implanted region of the substrate surface (Regions B and D) than exists (higher threshold voltage) at the unimplanted substrate surface areas (areas A and C). It will be noted also that the structure produced by this process is characterized by a uniform thickness insulating layer beneath each and every one of the phase electrodes. The advantages outlined in respect of the embodiment described with respect to FIG. 1 also apply to the structure formed by the process described with reference to FIG. 2. Typically, gate lengths $L = 0.2$–$0.5$ mils may readily be achieved using this process. Instead of using implanted arsenic regions 54 and 60 in an n-channel structure, to form implanted potential wells, arsenic could also be used to implant corresponding regions in a n-channel structure to form implanted potential barrier regions 54 and 60; such structure would be characterized by a reverse direction of charge propagation along the channel compared with the p-channel structure. Alternatively, arsenic could be used to form potential barriers in a p-channel structure by this process.

It is also noteworthy that the process described with reference to FIG. 2 can be used in conjunction with a buried channel CCD as well as with a surface channel CCD as specifically described above. In order to provide a buried channel CCD structure, an n-type dopant implant could be carried out either before or after the oxidation step described with reference to FIG. 2A in order to define an n-type layer across the whole channel surface of the CCD. The reaminder of the process steps would remain unchanged except that the implanted regions would be at the interface of the n-type layer and the silicon oxide layer. A buried channel CCD thus produced is advantageous over a buried channel CCD structure incorporating a stepped insulator structure in which the charge is stored under the thick oxide regions which have a lower capacitance, resulting in reduced charge capacity for such a buried channel CCD structure. Furthermore, the process described with reference to FIG. 2 offers advantages in respect of surface channel CCDs compared with those associated with a stepped oxide structure wherein these are practical limits in the magnitude of the step between the thin and thick oxide regions. Foe example, if the size of the step is increased with the objective of increasing charge capacity, problems can be encountered such as obtaining adequate coverage of the step when forming the second level metal electrodes, as well as due to excessive undercutting when etching the oxide to define the steps.

Figure 3A:
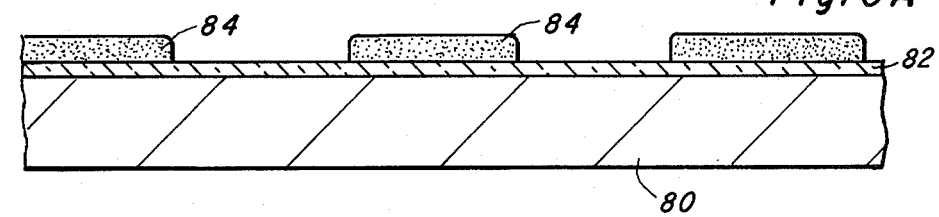
Figure 3B:
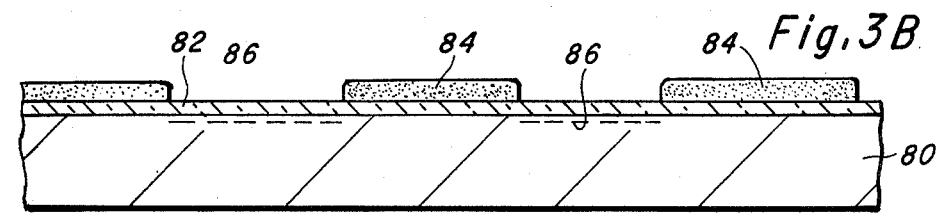

A further embodiment of the invention will be described with reference to FIG. 3. As shown in FIG. 3A, starting with a p-type silicon substrate 80, a layer 82 of silicon oxide is formed on a surface thereof to a thickness suitably about 1000 Å. Preferably a thermal oxidation process is used. A layer of photoresist is formed over the silicon oxide layer 82 and patterned, using conventional photolithographic techniques, to define photoresist strips 84 spaced apart along the length of the channel of the CCD and each extending over the width of the channel. P-type dopant ions are then implanted between the photoresist areas 84 (which act as an implantation mask) to define implanted layers 86 in the surface of the substrate 80 so that the peak of implanted ion distribution is just beneath the surface of the substrate 80, thereby negative surface charge layers as depicted in FIG. 3B. Suitably a beam energy of 50 keV and dosage of $1.5 \times 10^{12}$ may be used. Photoresist areas 84 are then stripped and a layer of polycrystalline silicon is deposited. The polycrystalline silicon may be doped during or following deposition, as discussed with reference to FIG. 2, to provide a good electrical conductor. The polycrystalline layer is then patterned to define phase electrode strips extending across the width of the CCD channel and in offset alignment relative to the implanted layers 86 so that, along the length of the channel, part e.g. one-half of the length of each polysilicon electrode 88 overlies a portion of each implanted layer 86, as shown in FIG. 3C.

The areas of the silicon oxide layer 82 between the polysilicon electrodes 88 are then etched away to uncover the underlying surface areas of the substrate 80 as shown in FIG. 3D and then a layer of silicon oxide is formed by thermal oxidation to provide regrown areas 90 of silicon oxide between the polysilicon electrodes 88 and to have the same thickness as the silicon oxide regions 82a underlying the electrodes 88. At the same time, a silicon oxide layer 92 is also formed over the surface areas of the polysilicon electrodes 88. During formation of the silicon oxide areas 90, 92, a large portion of the boron implanted layers 86 not covered by silicon oxide layers 82a are consumed by the oxide during growth of the oxide areas 90, the segregation coefficient of boron favoring diffusion of boron out of the silicon into the oxide areas 90 during formation thereof. Consequently, a small amount of implanted boron ions remains in surface areas of the substrate 80 between the polycrystalline silicon electrodes 88, thereby achieving self-alignment of the boron implants 86a beneath the polycrystalline silicon electrodes 88.

A photoresist layer is then formed over the structure shown in FIG. 3E and patterned to form photoresist regions 96 covering part, e.g. one-half, of the length of each of the oxide areas 90 next adjacent an edge of a polycrystalline silicon electrode 88 beneath which there is an implanted layer. The resultant structure, shown in FIG. 3F, is then subjected to a further implantation of p-type dopant ions, again suitably boron, to form implanted layers 98 in the silicon surface beneath the areas of the silicon oxide regions 90 unmasked by the photoresist regions 96, the implanted regions again extending across the width of the channel of the CCD. Suitably a beam energy of 60 keV and dosage of $1.5 \times 10^{12}$ may be used. The photoresist areas 96 are then stripped and the structure annealed, suitably at a temperature of about 800 -1000° C., to electrically activate the boron implants.

A conductive layer, suitably metal or conductive semiconductor material (e.g., aluminum or polycrystalline silicon) is then formed and patterned to define a second level of phase electrode strips 100 extending across the width of the CCD channel between the polysilicon electrodes 88, with the marginal edges of the electrodes 100 overlapping edges of adjacent ones of the electrodes 88 as shown in FIG. 3G. Typically, gate lengths of L - 0.2-0.5 mils may readily be achieved using this process.

Once again, it will be seen that the required surface potential (threshold voltage) asymmetry is provided beneath at each of the phase electrodes 88 and 100, since the implanted boron layers (in regions A and C) provide potential barriers resulting in potential wells, defined during operation of the CCD structure, which are deeper in the unimplanted regions (regions B and D) than at the implanted regions. Alternatively viewed, the threshold voltages at the implanted regions are higher than at the unimplanted regions.

The structure produced by this process offers advantages in that during operation of the resultant CCD structure, the charge packets are stored in unimplanted regions so that the surface potentials are much lower than in a structure utilizing implanted potential wells. This feature can be of particular importance in buried channel CCD structures since it results in DC levels required in peripheral circuits, e.g., input diodes, precharge diodes, etc., much more compatible with those used in CCD structures produced by conventional methods. The process described with reference to FIG. 3 can be modified to produce a buried channel structure in the same manner as described with reference to FIG. 2.

In each of the above described processes, the polycrystalline silicon electrodes suitably are about 1500 to 6000 A thick. Also, electron beam or X-ray lithography could be used in place of the described photolithography, to achieve further reduction in geometrics.

In relation to FIG. 2, the potential well region in gate regions B and D may be replaced by implanted potential barrier regions in gate regions A and C, suitably using boron as the ion source.

In carrying out the process steps described with reference to FIGS. 1 to 3, in each case the two levels of phase or gate electrodes would extend from individual bus conductors, which suitably may be patterned simultaneously with the patterning of the associated electrodes, for receiving respective phases of a two-phase clock source for operation of a CCD in known manner.

What is claimed is:

1. In a method of fabricating a charge coupled device including an elongated channel overlaid by phase electrodes extending across the channel, a first set of alternate ones of said electrodes being formed by process steps separate from the prior to process steps forming a second set comprising the intervening electrodes, said electrodes being electrically isolated from each other and from an underlying surface of a semiconductor substrate in which said channel is defined, corresponding portions of said electrodes being underlaid by modified surface potential regions in said semiconductor surface extending across said channel, the improved method of forming said modified surface potential regions under said first set of electrodes comprising the steps of:

forming a uniform thickness layer of insulating material on said surface of said semiconductor substrate;
implanting dopant ions into said insulating layer at spaced regions thereof across said channel;
forming strips of polycrystalline material over said insulating layer to define said first set of phase electrodes extending across said channel such that first portions of said strips overlie respective portions of said doped regions of the insulating layer while second portions of said strips overlie undoped regions of said insulating layer, said polycrystalline strips being formed by a process which causes no significant diffusion of said dopant material from said insulating layer into said semiconductor substrate;
removing said insulating material from between said polycrystalline strips and forming a layer of insulating material over said polycrystalline strips and between said polycrystalline strips to have said uniform thickness between said polycrystalline strips;
and during said fabrication heating said insulating material to cause significant out diffusion of said implanted dopant impurities into the surface of said semiconductor substrate to form modified surface potential regions underlying said corresponding portions and self-aligned with corresponding edges of said polycrystalline strips.

2. A method according to claim 1, wherein said modified surface potential regions are potential well regions.

3. A method according to claim 1, wherein said substrate surface comprises a thin layer of semiconductor material of conductivity type opposite from that of underlying semiconductor material to define a buried channel for said charge coupled device.

4. A method according to claim 3, wherein said opposite conductivity type layer of semiconductor material is formed by implantation of dopant ions into said substrate surface.

5. A method according to claim 1, wherein said polycrystalline material comprises polycrystalline silicon and said insulating material comprises silicon oxide.

6. In a method of fabricating a charge coupled device having a channel overlaid by phase electrodes extending transversely of said channel with marginal edge portions of adjacent ones of said electrodes overlapping each other, said electrodes being electrically isolated by a single insulator material from each other and from an underlying surface of a semiconductor substrate wherein said channel is defined, the steps of:
forming a uniform thickness layer of said insulating material on said surface of the semiconductor substrate;
implanting dopant ions of one conductivity type into said insulating layer at spaced regions thereof across said channel;
forming strips of polycrystalline semiconductor material over said insuating layer to define phase electrodes extendng transversely of said channel such that first portions of said strips overlie respective portions of said doped regions of the insulating layer while second portions of said strips overlie undoped regions of said insulating layer, said polycrystalline semiconductor strips being formed by process steps causing no significant diffusion of said dopant material from said insulating layer into said semiconductor substrate;
removing said insulating material from between said polycrystalline semiconductor strips and forming a layer of said insulating material over said polycrystalline semiconductor strips and between said polycrystalline semiconductor strips to have said uniform thickness between said polycrystalline strips;
masking portions of said insulation material between said polycrystalline semiconductor strips and implanting dopant ions of said one conductivity type into respective unmasked surface areas bounded by an edge of said mask material and an edge of a polycrystalline strip covered by said insulating material and not underlaid by one of said modified surface potential regions;
forming conductive electrodes overlying said insulating material between said polycrystalline strips and marginally overlapping portions of adjacent polycrystalline semiconductor strip electrodes, such that said conductive electrodes and polycrystalline strips are substantially equally spaced from said semiconductor surface; and
using said first and second implanted dopant ions to form, respectively, in said semiconductor substrate first spaced apart modified surface potential regions underlying and self-aligned with corresponding edges of said first portions of said polycrystalline semiconductor strips, and second spaced apart modified surface potential regions underlying portions of and self-aligned with corresponding edges of said conductive electrodes next adjacent said second portions of said polycrystalline strips.

7. A method according to claim 6, wherein said modified surface potential regions are potential well regions.

8. A method according to claim 6 wherein said substrate surface comprises a thin layer of dopant ions of opposite conductivity type from said semiconductor material defining a buried channel for said charge coupled device.

9. In a method of fabricating a charge coupled device having a channel overlaid by phase electrodes extending transversally of said channel with marginal edge portions of adjacent ones of said electrodes overlapping each other, said electrodes being electrically isolated by a single insulator material from each other and from an underlying surface of a semiconductor substrate wherein said channel is defined, the steps of:
forming a uniform thickness layer of said insulating material on said surface of the semiconductor substrate;
implanting dopant ions of one conductivity type into said insulating layer at spaced regions thereof across the width of said channel;
forming strips of polycrystalline semiconductor material over said insulating layer to define phase electrodes extending transversally of said channel such that first portions of said strips overlie respective portions of said doped regions of the insulating layer while second portions of said strips overlie undoped regions of said insulating layer, said polycrystalline semiconductor strips being formed by a process which causes no significant diffusion of said dopant material from said insulating layer into said semiconductor substrate;
removing said insulating material from between said polycrystalline semiconductor strips and forming a layer of said insulating material over said polycrystalline semiconductor strips and between said polycrystalline semiconductor strips to have said uniform thickness between said polycrystalline strips by a process causing significant outdiffusion of said dopant impurities from said insulating layer into the surface of said semiconductor substrate to form first self-aligned regions having a modified surface potential underlying said first portions of said polycrystalline semiconductor strips;
masking portions of said insulation material between said polycrystalline semiconductor strips and implanting dopant ions of said one conductivity type into said semiconductor surface in respective areas bounded by an edge of said mask material and an edge of a polycrystalline strip covered by said insulating material and not underlaid by one of said first modified surface potential regions, thereby forming second spaced apart modified surface potential regions in said semiconductor surface;
forming conductive electrodes overlying said insulating material between said polycrystalline strips and marginally overlapping portions of adjacent polycrystalline semiconductor strip electrodes, such that said conductive electrodes and polycrystalline strips are substantially equally spaced from said semiconductor surface.

10. A method according to claim 9, wherein said dopant ions implanted into said insulating material have relatively high and low diffusion coefficients in said insulating material and said semiconductor material respectively.

11. A method according to claim 9, wherein said semiconductor material is silicon, said insulating material is silicon oxide and said dopant impurity is arsenic.

12. A method according to claim 11, wherein polycrystalline semiconductor material is deposited on said insulating material at a temperature in the range of about 700° to 800° C. and then patterned to define said polycrystalline semiconductor electrode stips, and wherein said further insulating material is formed by thermal growth at a temperature in the range of about 900°–1100° C.

13. A method according to claim 9, wherein said first and second modified surface potential regions are potential well regions.

14. A method according to claim 9, wherein said polycrystalline semiconductor strips extend from a common bus conductor.

15. A method according to claim 9, wherein said substrate surface comprises a thin layer of semiconductor material of conductivity type opposite from that of underlying semiconductor material.

16. A method according to claim 15, wherein said opposite conductivity type layer of smeiconductor material is formed by implantation of dopant ions into said substrate.

* * * * *